United States Patent [19]

Dahbura et al.

[11] Patent Number: 4,692,921
[45] Date of Patent: Sep. 8, 1987

[54] METHOD FOR GENERATING VERIFICATION TESTS

[75] Inventors: Anton T. Dahbura, Bedminster; Krishan K. Sabnani, Berkeley Heights, both of N.J.

[73] Assignee: American Telephone and Telegraph Company, AT&T Bell Laboratories, Murray Hill, N.J.

[21] Appl. No.: 768,500

[22] Filed: Aug. 22, 1985

[51] Int. Cl.⁴ .................................... G01R 31/28
[52] U.S. Cl. ......................... 371/27; 324/73 R; 371/15
[58] Field of Search ............... 371/15, 23, 25, 27; 324/73 R, 73 AT; 364/489

[56] References Cited

U.S. PATENT DOCUMENTS

| | | | |
|---|---|---|---|
| 4,519,078 | 5/1985 | Komonytsky | 371/25 |
| 4,601,032 | 7/1986 | Robinson | 371/23 |
| 4,604,744 | 8/1986 | Littlebury | 371/27 X |

*Primary Examiner*—Charles E. Atkinson
*Attorney, Agent, or Firm*—Henry T. Brendzel

[57] ABSTRACT

A method for developing test sequences that verify the operation of a finite state machine. The method includes developing a set of unique input/output sequences for the various states of the machine and constructing a test sequence for each edge of the machine. The test sequence is a concatenation of a head sequence that brings the machine to the head state of the tested edge, the input/output sequence associated with the tested edge, and a unique input/output sequence which verifies that the machine entered the expected tail state.

7 Claims, 2 Drawing Figures

METHOD FOR GENERATING VERIFICATION TESTS

BACKGROUND OF THE INVENTION

This invention relates to testing of electronic circuits and, more particularly, to the creation of testing sequences based on a circuit's specifications.

There has always been a need for testing the designs and verifying the operation of electronic systems. In the past, such testing and verifying was devised by the system designers who relied on their knowledge of the intended system behavior and the actual system design.

With advances in Very Large Scale Integration (VLSI), however, this became more difficult. One reason for the difficulty in devising these tests is that there are no internal test points which can be accessed and tested to isolate faults. Another reason is that, most commonly, no repair options are available. Still another reason is that the design philosophy has changed from designs that aim to reduce transistor count, to designs that concentrate on reducing chip "real estate" and input/output interconnection complexities.

The number of active elements created within an integrated circuit currently runs in the hundreds of thousands, and the art is continually striving to increase this number. The masks that must be developed to create these circuits are quite expensive and, therefore, a serious concern in the design of these integrated circuits is that the circuit should perform as intended without undue experimentation. Another concern is that the manufacture of the integrated circuits should not introduce flaws in the circuits, e.g., active elements that are stuck at 1 or stuck at 0. An even more important concern is that manufactured IC's which contain flaws should be detected quickly and easily.

To address these concerns, designers have attempted to mechanize the testing process with equipment similar to that disclosed by U.S. Pat. No. 3,883,801, issued May 13, 1975 to G. C. Hess. In the disclosed equipment, a (vector) signal is applied to a circuit under test and the sequence of output signals from the circuit are combined to produce a single binary word that is compared to a reference binary word characteristic of a properly operating circuit. A test pattern is necessary for such test equipment so designers have also attempted to mechanize the development of testing sequences that would appropriately exercise the manufactured integrated circuits. Creating effective tests for circuits that include hundreds of thousands of active elements is by no means trivial, and developing effective tests that are efficient is even more difficult.

In another aspect of the testing problem, one is sometimes faced with the need to test a circuit or system whose design is not known. For example, in the present burgeoning of the telecommunications field, public data networks with specific access protocols have been built in several countries. These networks can interconnect computers and terminals from different vendors as long as the protocols are adhered to. The protocols defining the interfaces are quite complex, and the equipment designed for communicating via these protocols are likewise complex. Before any equipment is connected to a public network, the protocol implementations must be certified to make sure that they conform to the published standard, but establishing certification tests is difficult because the equipment of different vendors is designed by those vendors, and their designs are not known.

It is an object of this invention to develop an effective method for creating a concise set of input/output sequences for testing complex electronic circuits or systems.

It is another object of this invention to provide a method for creating a concise set of input sequences and expected output sequences based on the functional description of circuits or systems.

SUMMARY OF THE INVENTION

These and other objects of the invention are achieved, in accordance with the principles of our invention, with a method that tours through and tests all edges of the finite state machine. A test for each edge is developed by constructing a three-part test sequence. The first part is a sequence that places the machine at the head state of the edge; that is, at the state via which the edge is reached. The second part exercises the machine by executing the transition of the edge; that is, supplying the input signal expected by that edge. Traversing the edge places the machine at the tail state of the edge, but to verify that the tail state was indeed reached, the third part is a sequence that provides an input/output sequence which is unique to the tail state.

In a preferred embodiment, developing the test sequences proceeds by first developing the test sequence with the longest head sequences. That is, the test sequence is developed for those edges that require the longest sequence for the initial state of the machine. In this manner, those edges are tested and, in addition, a number of edges traversed by the head sequence are also tested; thereby reducing the number of required test sequences.

DETAILED DESCRIPTION

Digital circuits can be described as finite state machines which, in response to known input sequences, develop predesigned output sequences. They are called finite state machines because, unlike analog circuits, they can assume only a finite number of internal states, and they transit from one state to another in response to input stimuli. Thus, a finite state machine can also be said to be specified by its response to input sequences.

Figure 1:
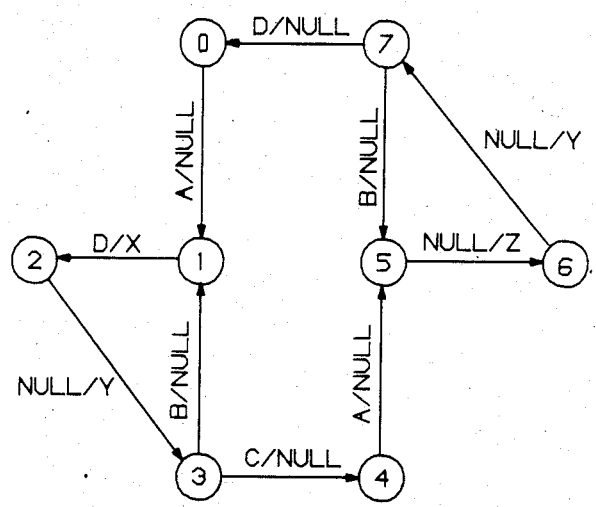
FIG. 1 depicts a state diagram of a finite state machine.

One way to describe finite state machines is with a state diagram like the one depicted in FIG. 1. It provides a visually understandable means for comprehending the machine's operation. In state diagrams, a state of the machine is described by a circle and a transition from one state to another is described by an arrow which sometimes is referred to as an edge. The number within each circle identifies the state. The designation along each edge identifies the input i, and the observable circuit response, or output o, that is associated with a transition of one state to the next. The input/output pair is the label of the state transition or edge. In context of the instant disclosure, a sequence, S, is specified by $S = (i_1/o_1)(i_2/o_2) \ldots (i_n/o_n)$, which describes both the sequence of inputs, and the expected sequence of outputs. An input ri is the reset input which places the machine into its initial, reset, state regardless of the current state of the machine. The input or output "null" is self-explanatory, but it is mentioned here to highlight the fact (as shown in FIG. 1) that some state transitions do not yield an output signal. The difficulty with edges having null inputs is that the machine traverses more than one edge in response to a single input. The difficulty with edges having null outputs is that, externally, no output is present to indicate that a new state was reached.

The kernel of our invention lies in a method for computing unique input/output (UIO) sequences, for efficiently traversing all of the possible state transitions of a digital circuit, and for combining the different unique input/output sequences to generate a test sequence.

In accordance with the principles of our invention, once the state diagram specifying the finite state machine is known, such as in FIG. 1, a unique test sequence for each state and for each edge can be developed. The example of FIG. 1 shall serve to illustrate the principles of our invention in the description that follows. It may be noted that FIG. 1 describes a state machine with input signals A, B, C, D, and the null input, and output signals X, Y, Z and null. The ri input is also present but is not shown in FIG. 1.

In accordance with the state diagram of FIG. 1, placing the machine at state 0 (the initial, reset state) and applying input A should yield the null output and place the machine in state 1. Unfortunately, the user has no way of knowing that the machine was placed in state 0, that the edge between states 0 and 1 has been traversed, or that state 1 was in fact reached. Indeed, if, per chance, state 4 was reached instead of state 0, the transition from state 4 to state 5 could have occurred in response to input A because both, the edge connecting states 4 and 5 and the edge connecting states 0 and 1, have the label (A/null). What is needed therefore, is a longer sequence that would verify the fact that state 0 was reached. That can be achieved, for example, with the sequence (ri/null)(A/null)(D/X)(null/Y).

Summarizing, one should apply the input sequence {ri, A, D, null} and observe that the output sequence {null, null, X, and Y} results. It should be noted that the D/X entry would be sufficient to form a UIO sequence, but the last input (null) is a non-input and occurs without further ado. Furthermore, the last output (Y) is observable and provides valuable information.

Generalizing from the above example, our method for developing a test sequence for a finite state machine tours through all edges of the machine and in the process passes through all the states. Each test sequence comprises a head sequence, a label, and a tail sequence. The head sequence aims to bring the machine to the head state of the edge that is to be tested; the edge's label, appended to the head sequence, verifies the expected response of the edge and places the machine at the tail state of the tested edge; and the tail sequence, appended to the label, verifies that the tail state of the tested edge has indeed been reached.

Figure 2:
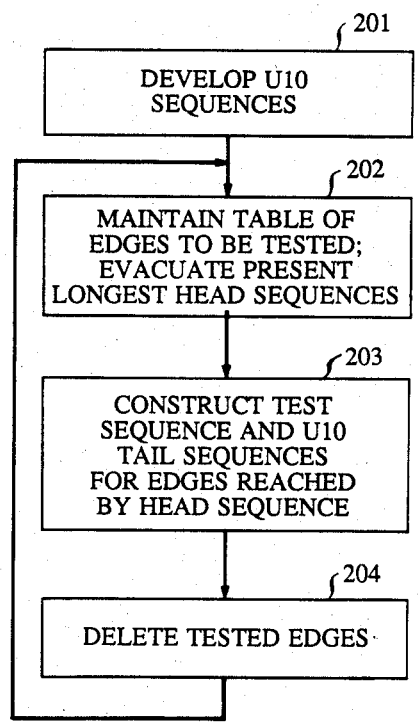
FIG. 2 presents a flow chart describing the method of our invention for developing test sequences for machines describable by state diagrams.

Applying the above philosophy, the details of our method for developing a test sequence for a finite state machine proceed in accordance with the steps described below and depicted in FIG. 2:

Step 1 (block 201 in FIG. 2)

A preliminary step in our method is one of computing a UIO sequence from each state of the machine. Although these computations can be done "on the fly" as a UIO sequence is needed, developing a table of UIO sequences is perhaps more efficient. The following describes a procedure for developing a table of UIO sequences.

Substep A:

List all labels in Table A, and for each label, identify the head state and the tail state of the edges having that label. That is, develop entries associating edges such as (0,1) with labels such as (A/B) to indicate that the edge between states 0 and 1 has the label (A/B).

Substep B:

Identify all edges in Table A with a label having a null input, and all edges whose tail state is the head state of an edge with a null input. Those latter edges place the machine in a temporary tail state because at that state there is an outgoing edge (always a single one) which automatically advances the machine to the next tail state. To account for these situations, each edge that connects a head state i to a tail state j (i,j) which is a temporary tail state is represented by a "meta-edge" connecting state i to state k, having a label that is a concatenation of the two edge labels. Create Table B which associates all valid edges and meta-edges with their labels, and associates all subsumed edges with their corresponding meta-edges.

Substep C:

Sort Table B lexically on edge labels, and mark labels that appear only once. Sort again, on head states (the sorting and resorting is, of course, optional). The marked labels are unique and, therefore, each can serve as the UIO sequence for verifying the head state of its associated edge.

Substep D:

Those head states in Table B which do not have outgoing edges (simple or compound) that are UIO sequences (i.e., marked) must develop longer sequences that are UIO sequences. One can compute a UIO sequence for each such edge by identifying the set of outgoing edges from each such tail state and testing the inclusion of each member of the set to determine whether a UIO sequence results. If none results in a UIO sequence, the process is repeated for an additional level of outgoing edges, until all states are assigned a UIO sequence.

Although substep D rigorously develops a UIO sequence for each head state, in accordance with our preferred approach, this step may be omitted. The rationale for this is that a particular long UIO sequence may be preferred over short UIO sequences. Accordingly, it is preferable not to expend computing resources on an a priori evaluation of a UIO sequence for each and every state.

The following assumes that step D is not carried out because in our calculations that follow, we compute the longest head sequence deep in the graph, and we expect that some UIO sequences will be included therein, relieving our burden of computing a UIO sequence for each head state.

Step 2 (block 202 in FIG. 2)

From the initial state of the finite state machine, determine the length of the present longest head sequence for reaching some edge or edges in the state diagram of the machine. This is the present longest head sequence for the machine. It should be noted that there may be more than one edge (emanating from the same or different head states) that requires a sequence of such length.

When different head states are involved, this leads to more than one "longest head sequence". Evaluate the present longest head sequences and maintain a record of the edges traversed by each sequence.

By the phrase "longest head sequence" we mean the following: Starting at the initial state of a machine, some edges in the state diagram can be reached with short sequences, while other edges require long sequences. One edge, or a few edges, would have the distinction of requiring the longest head sequence before that edge or edges can be reached. One could, of course, construct an even longer sequence for reaching a particular edge, but such a sequence would not be the shortest path to that edge.

The longest head sequence can be determined by computing the shortest path to each edge and selecting the longest computed path. One algorithm for computing the shortest path to an edge is known as the Dijkstra algorithm. A description of this algorithm is found, for example, in "The Design and Analysis of Computer Algorithms," Aho et al., Addison-Wesley Publishing Co., Reading, Mass., 1976, Section 5.10, pp 207-209. This algorithm develops the shortest path from any state to any other state. Our step 1 requires only the shortest paths from state 0 to any other state, so it is a subset of the Dijkstra algorithm.

Step 3 (block 203 in FIG. 2)

For each edge requiring a head sequence corresponding to the present longest head sequence construct a test sequence by appending to the head sequence a) the sequence that traverses that edge, i.e., the edge label, and b) a UIO tail sequence to assure uniqueness.

The addition of the sequence that traverses the edge is, of course, required to exercise the machine and determine that the edge specified by the state diagram does exit; that is, that the expected output will result in response to the specified input. Testing of that edge is incomplete, as discussed above, because traversal of the edge per se does not also verify that the machine entered the next specified state. Accordingly, a tail sequence is appended that is sufficiently long (i.e., a UIO sequence) to insure that the medicine is at the correct state.

Step 4 (block 204 in FIG. 2)

Delete from the list of edges to be checked (Table A) all edges tested by the sequences of step 2 and return to step 2 to evaluate a new "longest head sequence".

The above three-step procedure by design checks all edges outgoing from the head state of the "longest head sequences". Each of the head sequences, however, may also be checking various edges in the process of reaching its destined head state. Therefore, in accordance with the method of this invention, each edge in the "longest head sequence" is checked to determine whether it is followed by a UIO sequence. If it is, then it may be said that a test sequence for that edge is included in the "longest head sequence" and that the edge need not be checked again.

EXAMPLE

To illustrate the above-described method, the state diagram of FIG. 1 is evaluated.

| Step 1 for FIG. 1 |  |
|---|---|
| Substep A: Develop a list of edges and their labels |  |
| Edges | Label |
| (0,1) | (A/null) |
| (1,2) | (D,X) |
| (2,3) | (null/Y) |
| (3,1) | (B/null) |
| (3,4) | (C/null) |
| (4,5) | (A/null) |
| (5,6) | (null/Z) |
| (6,7) | (null/Y) |
| (7,5) | (B/null) |
| (7,0) | (D/null) |

| Substep B: Develop meta-edges - Table B | | |
|---|---|---|
| Meta Edges | Subsumed Edges | Label |
| (0,1) |  | (A/null) |
| (1,3) | (1,2) (2,3) | (D/X)(null/Y) |
| (3,1) |  | (B/null) |
| (3,4) |  | (C/null) |
| (4,7) | (4,5) (5,6) (6,7) | (A/null)(null/Z)(null/Y) |
| (7,7) | (7,5) (5,6) (6,7) | (B/null)(null/Z)(null/Y) |
| (7,0) |  | (D/null) |

| Substep C: Determine the UIO sequences - Table B | | | |
|---|---|---|---|
| UIO | Meta Edges | Subsumed Edges | Label |
| yes | (0,1) |  | (A/null) |
| yes | (1,3) | (1,2) (2,3) | (D/X)(null/Y) |
| yes | (3,1) |  | (B/null) |
| yes | (3,4) |  | (C/null) |
| yes | (4,7) | (4,5) (5,6) (6,7) | (A/null)(null/Z)(null/Y) |
| yes | (7,7) | (7,5) (5,6) (6,7) | (B/null)(null/Z)(null/Y) |
| yes | (7,0) |  | (D/null) |

In the above example, substep D is not even necessary because each of the pseudo edges to be tested has a label that happens to be a UIO sequence. That is, each label is unique.

Step 2 for FIG. 1

The FIG. 1 machine has only one longest head sequence, reaching state 7, two edges emanate therefrom: that being the edge between state 7 and state 0 and the edge between state 7 and 5. Hence, the optimum longest head sequence for the FIG. 1 state diagram is (ri/null)(A/null)(D/X)(null/Y)(C/null)
(A/null)(null/Z)(null/Y)

and it traverses edges (0,1)(1,2)(2,3)(3,4)(4,5)(5,6)(6,7).

Step 3 for FIG. 1

Develop the test sequences for edges (7,0) and (7,5). To do so, we need the edge labels and the UIO sequences for states 0 and 5. The labels of edges (7,0) and (7,5) as well as the needed UIO sequences are obtained from the table of step 1.

Proceeding from the table entries edge (7,0) is found in the meta-edge column (last entry) and it carries the label (D/null). State 0 serving as a head state is also found in the meta-edge column and its associated UIO is (A/null). Hence, one test is (ri/null)(A/null)(D/X)(null/Y)(C/null)

(A/null)(null/Z)(null/Y)(D/null)(A/null).

Edge (7,5), however, is not found in the meta-edge column of the table, but is found to be subsumed by meta-edge (7,7). The label of (7,7) is a UIO, hence the second test is (ri/null)(A/null)(D/X)(null/Y)(C/null)
(A/null)(null/Z)(null/Y)(B/null)(null/Z)(null/Y).

Step 3 for FIG. 1

(A) Delete edges (7,5) and (7,0)

(B) Reviewing the longest head sequence employed, it is noted that the last edge traversed before head state 7 was reached is edge (6,7). From Table B it is determined that state 7 has a UIO associated with meta-edge (7,7) and a UIO associated with edge (7,0). Since the UIO associated with meta-edge (7,7) is used in one of the above tests, edge (6,7) may be deleted from Table A.

Continuing, the penultimate edge of the longest head sequence is edge (5,6) and from the table substep C, it is determined that state 6 has a UIO that is the same as the UIO for state 7. Accordingly, edge (5,6) may be deleted from Table A.

By similar reasoning, edges (4,5), (3,4), (2,3), (1,2) and (0,1) may be deleted from Table A. What is left in Table A is edge (3,1).

At this point in the procedure, steps 1 through 3 are to be repeated. The resulting longest head sequence is the sequence leading to state 3, and that sequence is (ri/nul)(A/null)(D/X)(null/Y). From the tables it is determined that the label for edge (3,1) is (B/null) and the UIO for state 1 is (D/X)(null/Y). This yields the test sequence (ri/null)(A/null)(D/X)(null/Y)(B/null)(D/X-)(null/Y).

The test situation for meta-edge (7,7) above is particularly interesting, and its highlighting herein may be helpful: Meta-edge (7,7) is, in effect, a loop which divulges the state that the machine has reached without changing the state of the machine. Input B causes the machine to pass through state 5 and 6 and to return to state 7. Since the state of the machine does not change in the final analysis, a unique output for such a loop would constitute a UIO for testing the state. In FIG. 1 the loop traversed states 5 and 6, but it need not traverse any states. Realizing this, a finite state machine may advantageously be designed with a plurality of loops judiciously interspersed to reduce testing. In this manner, all UIO sequences of a machine can be reduced to a single edge comprising an input which may be a selected UIO input, and a unique output characteristic of the machine's state. Additionally, a finite state machine may be designed where it can be preset to some useful states, thereby reducing the required lengths of the head sequences.

It should be appreciated that the details of the method as described above are merely illustrative of the principles of our invention, and that modifications can easily be made that are within the bounds and scope of our invention. For example, although we chose to start with the longest head sequence (because in the process of testing a distant edge, closer edges may be tested) we could easily start with short head sequences and delve progressively deeper into the state diagram. Of course, if we choose the latter strategy, it would behoove us to examine whether some sequences are completely subsumed by other sequences. The subsumed sequences can, of course, be deleted.

What is claimed is:

1. A method for developing test sequences for evaluating a design or operation of a finite state machine characterized by a state diagram having states and edges interconnecting such states, comprising:
    a step of evaluating unique input/output sequences for states of said finite state machine;
    a step of evaluating a head sequence for a selected edge of said finite state machine, said edge having a head state and a tail state, wherein said head sequence places said finite state machine in said head state;
    a step of constructing a test sequence for said selected edge by concatenating said head sequence with an input/output sequence characteristic of said edge and with a unique input/output sequence of said tail state derived from said step of evaluating unique input/output sequences; and
    returning to said step of evaluating a head sequence for another selected edge of said finite state machine until all edges of said finite state machine have been selected.

2. The method of claim 1 wherein said step of evaluating a head sequence evaluates the longest head sequence for reaching an edge for which a test sequence has not been constructed.

3. The method of claim 1 wherein said head sequence begins with a reset input.

4. A method for developing test sequences for evaluating the operation of a finite state machine characterized by a state diagram having states and edges interconnecting said states comprising:
    a first step, evaluating unique input/output sequences for states of said finite state machine;
    a second step, maintaining a table identifying edges of said machine that remain to be tested;
    a third step, evaluating a head sequence for a selected edge having a head state and a tail state, where the tail state corresponds to the state which the machine reaches after traversing said selected edge from the head state, and where the head sequence places said finite state machine in said head state;
    a fourth step, constructing a test sequence for said selected edge by concatenating said head sequence with an input/output sequence characteristic of said edge and with a unique input/output sequence of said tail state derived from said step of evaluating unique input/output sequences;
    a fifth step, deleting from said table said selected edge of said second step and each edge that said head sequence subsumes and includes a unique input/output sequence of said edge derived from said first step; and
    a sixth step, returning to said step of evaluating a head sequence for another selected edge of said finite state machine until all edges of said finite state machine have been selected.

5. The method of claim 4 wherein said head sequence evaluated in said third step is the longest current head sequence, considering the edges of said finite state machine that remain in said table.

6. The method of claim 4 wherein said head sequence evaluated in said third step begins with a reset input.

7. The method of claim 1 further comprising a step of discarding test sequences developed by said step of constructing a test sequence that are subsumed by other of said test sequences.

* * * * *

UNITED STATES PATENT AND TRADEMARK OFFICE
CERTIFICATE OF CORRECTION

PATENT NO. : 4,692,921

DATED : September 8, 1987

INVENTOR(S) : Anton T. Dahbura and Krishan K. Sabnani

It is certified that error appears in the above-identified patent and that said Letters Patent is hereby corrected as shown below:

Column 5, line 40, "exit" should read --exist--. Column 6, line 7, "(D,X)" should read --(D/X)--.

Signed and Sealed this

Twenty-ninth Day of March, 1988

Attest:

DONALD J. QUIGG

*Attesting Officer*   *Commissioner of Patents and Trademarks*